United States Patent [19]
Bhamidipaty

[11] Patent Number: 5,107,142
[45] Date of Patent: Apr. 21, 1992

[54] APPARATUS FOR MINIMIZING THE REVERSE BIAS BREAKDOWN OF EMITTER BASE JUNCTION OF AN OUTPUT TRANSISTOR IN A TRISTATE BICMOS DRIVER CIRCUIT

[75] Inventor: Achyutram Bhamidipaty, Milpitas, Calif.

[73] Assignee: Sun Microsystems, Inc., Mountain View, Calif.

[21] Appl. No.: 605,566

[22] Filed: Oct. 29, 1990

[51] Int. Cl.⁵ .............. H03K 19/01; H03K 19/094; H03K 19/082; H03K 19/017

[52] U.S. Cl. .................... 307/446; 307/451; 307/473; 307/475; 307/570

[58] Field of Search .......... 307/446, 448, 473, 570, 307/475, 450, 451, 279

[56] References Cited

U.S. PATENT DOCUMENTS

| | | | |
|---|---|---|---|
| 4,649,294 | 3/1987 | McLaughlin | 307/446 |
| 4,703,203 | 10/1987 | Gallup et al. | 307/473 X |
| 4,746,817 | 5/1988 | Banker et al. | 307/446 |
| 4,791,320 | 12/1988 | Kawata et al. | 307/446 |
| 4,804,868 | 2/1989 | Masuda et al. | 307/446 |
| 4,804,869 | 2/1989 | Masuda et al. | 307/446 |
| 5,006,732 | 4/1991 | Nakamura | 307/473 |

Primary Examiner—David C. Nelms
Assistant Examiner—David R. Bertelson
Attorney, Agent, or Firm—Blakely, Sokoloff, Taylor & Zafman

[57] ABSTRACT

A tristate driver circuit including a first output transistor for furnishing a first output voltage at an output terminal in the on condition, the first transistor being susceptible to disablement or degraded operation from back biasing in the presence of voltages above a particular level at the output terminal in the off condition, a second output transistor for furnishing a second output voltage at the output terminal in the on condition, apparatus for biasing the first and second transistors to allow operation thereof in the presence of enable signals and to disable operation in the absence of enable signals, and apparatus for eliminating back biasing of the first transistor in the absence of enable signals.

6 Claims, 2 Drawing Sheets

Fig 1 - PRIOR ART

APPARATUS FOR MINIMIZING THE REVERSE BIAS BREAKDOWN OF EMITTER BASE JUNCTION OF AN OUTPUT TRANSISTOR IN A TRISTATE BICMOS DRIVER CIRCUIT

BACKGROUND OF THE INVENTION

1. Field of the Invention

This invention relates to computer circuitry and, more particularly, to apparatus for eliminating reverse bias breakdown in bi CMOS tristate driver circuits.

2. History of the Prior Art

Tristate driver circuits are used to place signals on the bus of a computer, among other things. In this application, these circuits provide a first voltage equivalent to a binary one condition, a second voltage equivalent to zero condition, and an open circuit condition. These circuits are used because it is desired when many different components are connected to a bus that the active driver circuits be able to produce the two distinct binary values for driving the bus but that the inactive driver circuits appear as though they do not exist as a bus connection when they are not driving the bus.

A significant problem of these circuits when formed in bi CMOS material is that significant voltage conditions on the bus may back bias the output transistors of the tristate drivers. If the back bias is large enough, these transistors may fail; if the voltage is less but is repeated enough times over a short enough period, the operation of the transistors may be degraded and they may ultimately fail.

SUMMARY OF THE INVENTION

It is, therefore, an object of the present invention to improve tristate driver circuits.

It is another more specific object of the present invention to provide improved bi CMOS tristate driver circuits which are not subject to reverse bias breakdown.

These and other objects of the present invention are realized in a tristate driver circuit comprising a first output transistor for furnishing a first output voltage at an output terminal in the on condition, the first transistor being susceptible to disablement or degraded operation from back biasing in the presence of voltages above a particular level at the output terminal in the off condition, a second output transistor for furnishing a second output voltage at the output terminal in the on condition, means for biasing the first and second transistors to allow operation thereof in the presence of enable signals and to disable operation in the absence of enable signals, and means for eliminating back biasing of the first transistor in the absence of enable signals.

These and other objects and features of the invention will be better understood by reference to the detailed description which follows taken together with the drawings in which like elements are referred to by like designations throughout the several views.

DETAILED DESCRIPTION OF THE INVENTION

Figure 1:
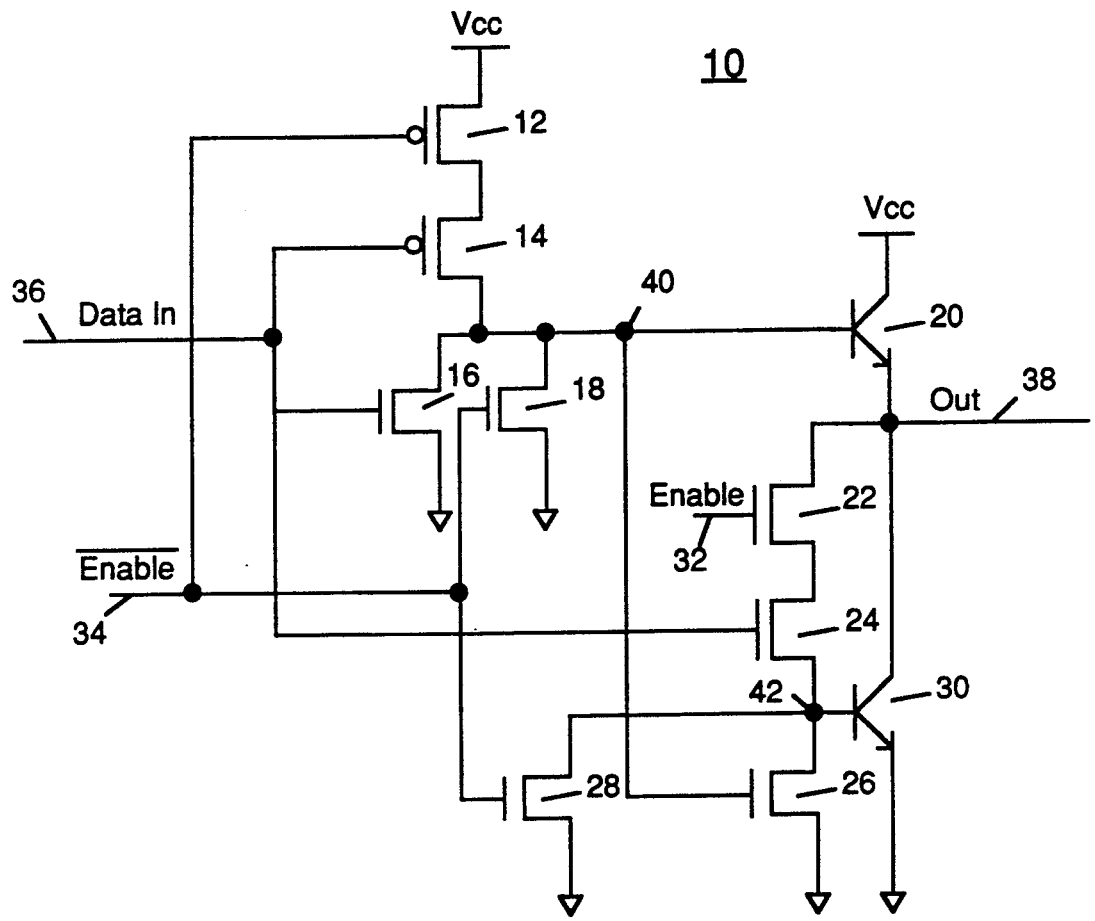
FIG. 1 is a circuit diagram of a tristate driver circuit constructed in accordance with the prior art.

Referring now to FIG. 1, there is illustrated a tristate driver circuit 10 constructed in accordance with the prior art. The circuit 10 includes a pair of field effect transistors 12 and 14 connected with their drains and sources in series between a voltage source Vcc and the base terminal of an output transistor 20. The field effect transistors 12 and 14 are both P-channel devices, and the transistor 20 is an NPN transistor. A second pair of field effect transistors 16 and 18 are connected in parallel between ground and the base of the transistor 20. The field effect transistors 16 and 18 are both N-channel devices. The transistor 20 has its collector connected to the voltage source Vcc and its emitter connected to an output terminal 38. The output terminal 38 is connected to the bus (not shown) and the signals to be provided at that point are a one (Vcc), a zero (ground), and an open circuit condition.

The circuit 10 also includes a second pair of N-channel field effect transistors 26 and 28 connected in parallel between ground and the base terminal of a second NPN transistor 30. The base of the transistor 30 is coupled to its collector by a pair of serially arranged N-channel field effect transistors 22 and 24. The collector of the transistor 30 is also connected to the output terminal 38 of the driver circuit 10. The emitter of the transistor 30 is connected to ground.

As pointed out, it is desired that the driver circuit 10 produce the following output signals: a one (Vcc), a zero (ground), and an open circuit condition. In fact, the circuit 10 acts as an inverter and produces the one output in response to a zero input and vice versa. In order to accomplish this, ENABLE and the inverse of ENABLE ($\overline{\text{ENABLE}}$) signals are provided at terminals 32 and 34, respectively; and input signals are provided at terminal 36. The ENABLE and $\overline{\text{ENABLE}}$ signals are used to either allow the input signal to be transferred to the output terminal 38 or to present an open circuit at the output terminal 38. In the operation of the circuit 10, when the ENABLE signal is high indicating a one, the $\overline{\text{ENABLE}}$ signal is low indicating a zero; and when the $\overline{\text{ENABLE}}$ signal is high indicating a one, the ENABLE signal is low indicating a zero.

The circuit operates in the following manner. When the circuit 10 is ENABLE signal, a positive enable voltage (a one) is applied at terminal 32 to the gate of the device 22. This turns on the device 22. Simultaneously, the $\overline{\text{ENABLE}}$ signal is low (a zero). This signal is furnished to the gate terminals of the devices 12, 18, and 28. This turns device 12 on and devices 18 and 28 off.

If the datum furnished on terminal 36 is a one, this value is furnished to the gate terminals of the device 14 and the device 16. This turns the device 14 off and the device 16 on. Consequently, ground rather than Vcc is furnished to the base of the transistor 20 forcing it low and turning it off.

Simultaneously, the one input at the terminal 36 is furnished to the gate of the device 24 turning it on. Since the device 22 is turned on by the ENABLE signal, the output terminal 38 is essentially connected to terminal 42 at the base of the device 30 and furnishes current thereto. When terminal 42 goes high, the transistor 30 starts to turn on. Some current flows through the devices 22 and 24, but most of the current flows through the transistor 30 essentially grounding the output terminal 38. Thus, in the enabled condition, a one at the input terminal 36 is inverted and applied as a zero at the output terminal 38.

If the datum on terminal 36 is a zero, on the other hand, a zero is applied at the gate terminal of device 14 to turn it on and at the gate terminal of device 16 to turn it off. Device 12 is also on since $\overline{\text{ENABLE}}$ is applied at its gate terminal. This causes terminal 40 at the base of the transistor 20 to rise toward the voltage Vcc and turn on the transistor 20. Turning on the transistor 20 applies the voltage Vcc at the output terminal 38.

Simultaneously, the zero input at the terminal 36 is applied to the gate terminal of the device 24 to turn it off while the voltage at terminal 40 is applied to the gate terminal of the device 26 to turn it on. This cuts off the charging current from the terminal 38 to the base of transistor 30 and provides a discharge path to ground at the terminal 42. This turns off the transistor 30. Consequently, in the enabled condition, a zero at the input terminal 36 is inverted and applied as a one at the output terminal 38.

When the circuit 10 is disabled, the $\overline{\text{ENABLE}}$ signal is a one while the ENABLE signal is a zero. Thus, devices 12 and 22 are off while devices 18 and 28 are on. This grounds both nodes 40 and 42. This means that both transistor 20 and 30 are turned off so that the output terminal 38 floats insofar as the driver circuit 10 is concerned. Consequently, the circuit 10 provides all of the signals desired of a tristate circuit.

However, while the circuit 10 is disabled, if another circuit drives the terminal 38 high, this creates a back bias across the emitter-base terminals of the transistor 20. If this condition remains for some time, then the operation of the transistor 20 may be degraded after some period of time or may fail after repeated applications of sufficient back biasing.

A circuit 50 constructed in accordance with the present invention (illustrated in FIG. 2) has been designed to avoid the possibility of this back bias condition destroying or degrading the operation of bi CMOS driver circuits. The circuit 50 includes an inverter 52 constructed in a manner well known to the prior art connected to receive the input signals. The output of the inverter 52 is applied to a parallel arrangement including a P-channel field effect transistor 54 and a N-channel field effect transistor 56. The parallel arrangement is connected to the base of an NPN transistor 60. Another parallel arrangement including a P-channel field effect transistor 58 and a N-channel field effect transistor 62 connects the base of the transistor 60 to its emitter terminal at an output terminal 80. In a similar manner to the circuit 10 of FIG. 1, a pair of N-channel field effect transistors 64 and 66 connect the output terminal 80 at the collector of an NPN transistor 70 to the base of that transistor 70. Another pair of N-channel field effect transistors 68 and 72 connect to the base of the transistor 70 and to ground. The emitter of the transistor 70 is grounded.

When the circuit 50 is ENABLE, a one signal is applied at an enable terminal 74. This signal is applied to the gate terminals of the N-channel devices 56 and 66 to turn those devices on. It is also applied to the gate terminal of the P device 58 to turn that device off. Simultaneously, an $\overline{\text{ENABLE}}$ signal of zero is applied at the terminal 76. The zero signal is applied to the gate terminals of the N-channel devices 62 and 68 to turn those devices off. It is also applied to the gate terminal of the P device 54 to turn that device on. Consequently, in the enable condition the parallel arrangement including the transistors 54 and 56 has both transistors on while the parallel arrangement including the transistors 58 and 62 has both transistors off.

If a one is applied to the input terminal 78 in this enabled condition, it is inverted and transferred by the inverter 52. Since the two transistors 54 and 56 are on, the inverted signal (zero) is transferred to the base of the transistor 60 causing it to go low. At the same time, the two transistors 58 and 62 are off and have no effect on the circuit. Thus, the transistor 60 is turned off.

Simultaneously, the one input is applied to the gate terminal of the device 64 turning it on. Since devices 64 and 66 are both on, the base of the transistor 70 is pulled toward the value of the output terminal 80, and the transistor 70 is turned on. Turning on the transistor 70 grounds the output terminal 80. Thus, the circuit 50 produces the same zero output signal in response to a one input signal in the enabled condition.

In a similar manner, when a zero is applied at the terminal 78, the inverter 52 produces a one which is transferred to the base of the transistor 60 through the devices 54 and 56. The devices 58 and 62 remain off, so the base of the transistor 60 goes high and the transistor 60 turns on. Simultaneously, the one signal from the inverter 52 at the gate terminal of the device 72 turns on that device while the zero signal from the input at the gate terminal of the device 64 turns that device off. Consequently, the transistor 70 is turned off, and the voltage Vcc is applied at the output terminal 80. Thus, a zero at the input terminal 78 is inverted and furnished to the output terminal as a one in the enabled condition.

Thus it will be understood that in the enabled condition the driver circuit 50 furnishes the same signals to the output for driving the bus as does the circuit 10 of FIG. 1.

In the disabled condition, the circuit 50 operates differently in order to eliminate the back biasing problem of the circuit 10. When the circuit 50 is disabled, the ENABLE signal is a zero and the $\overline{\text{ENABLE}}$ signal is a one. A zero ENABLE signal is applied to the gate terminals of the N-channel devices 66 and 56 to turn those devices off and to the gate terminal of the P device 58 to turn that device on. Simultaneously, the one $\overline{\text{ENABLE}}$ signal is applied to the gate terminals of the N-channel devices 62 and 68 to turn those devices on and to the gate terminal of the P device 54 to turn that device off. Thus, it will be seen that in the disabled condition, the device 68 pulls the base of the transistor 70 to ground while the device 66 cuts off current between the output terminal 80 and the base of the transistor 70. Thus the transistor 70 is off and has no effect on the circuit 50. At the same time, the parallel transistors 54 and 56 are both off while the parallel transistors 58 and 62 are both on. This essentially connects the base of the transistor 60 to the emitter of the transistor 60 and thus to the output terminal 80. The base of the transistor 60 is also disconnected from the inverter 52 so that the transistor 60 cannot turn on. The parallel arrangement of the devices 58 and 62 thus guaranties that no back bias can be applied to the emitter-base junction of the transistor 60 in the disabled state of the driver. Thus, the failure of the circuit through this back biasing is prevented by the circuit of this invention.

Although the present invention has been described in terms of a preferred embodiment, it will be appreciated that various modifications and alterations might be made by those skilled in the art without departing from the spirit and scope of the invention. The invention should therefore be measured in terms of the claims which follow.

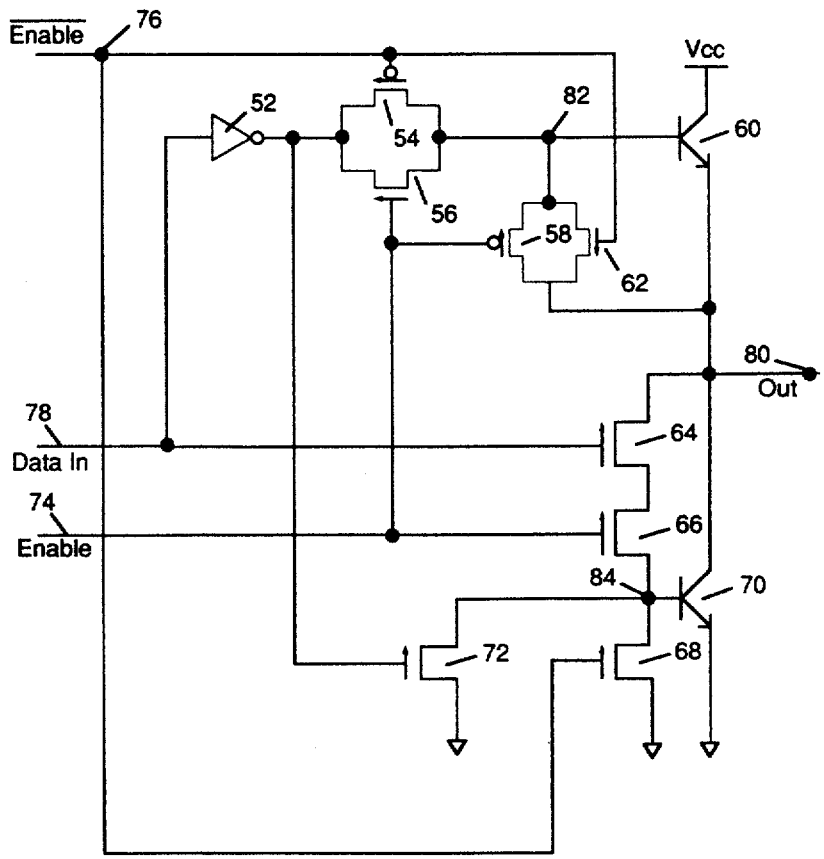

What is claimed is:

1. A tristate driver circuit comprising a first output transistor for furnishing a first output voltage at an output terminal in the on condition, the first transistor being susceptible to disablement or degraded operation from back biasing in the presence of voltages above a particular level at the output terminal in the off condition, a second output transistor for furnishing a second output voltage at the output terminal in the on condition, means for biasing the first and second transistors to allow operation thereof in the presence of enable signals and to disable operation in the absence of enable signals, and means for eliminating back biasing of the first transistor in the absence of enable signals.

2. A tristate driver circuit as claimed in claim 1 in which the means for eliminating back biasing of the first transistor in the absence of enable signals comprises a pair of field effect transistors connected in parallel between the terminals of the first transistor subject to back biasing, the pair of field effect transistors being rendered conductive by the absence of an enable condition.

3. A tristate driver circuit as claimed in claim 2 in which the pair of field effect transistors are connected in parallel between the base and emitter terminals of the first transistor subject to back biasing.

4. A tristate driver circuit as claimed in claim 3 in which the pair of field effect transistors are devices of opposite polarity, and in which a gate terminal of one of the field effect transistors receives the enable input signal and a gate terminal of the other one of the field effect transistors receives the inverse enable input signal.

5. A tristate driver circuit as claimed in claim 2 in further comprising a second pair of field effect transistors connected in parallel between the source of data and the base terminal of the first transistor.

6. A tristate driver circuit as claimed in claim 5 in which the second pair of field effect transistors are devices of opposite polarity, and in which a gate terminal of one of the field effect transistors of the second pair receives the enable input signal and a gate terminal of the other one of the field effect transistors of the second pair receives the inverse enable input signal.

* * * * *

UNITED STATES PATENT AND TRADEMARK OFFICE
CERTIFICATE OF CORRECTION

PATENT NO. : 5,107,142

DATED : April 21, 1992

INVENTOR(S) : Bhamidipaty

It is certified that error appears in the above-indentified patent and that said Letters Patent is hereby corrected as shown below:

The title page should be deleted to appear as per attached.

Figure 2:
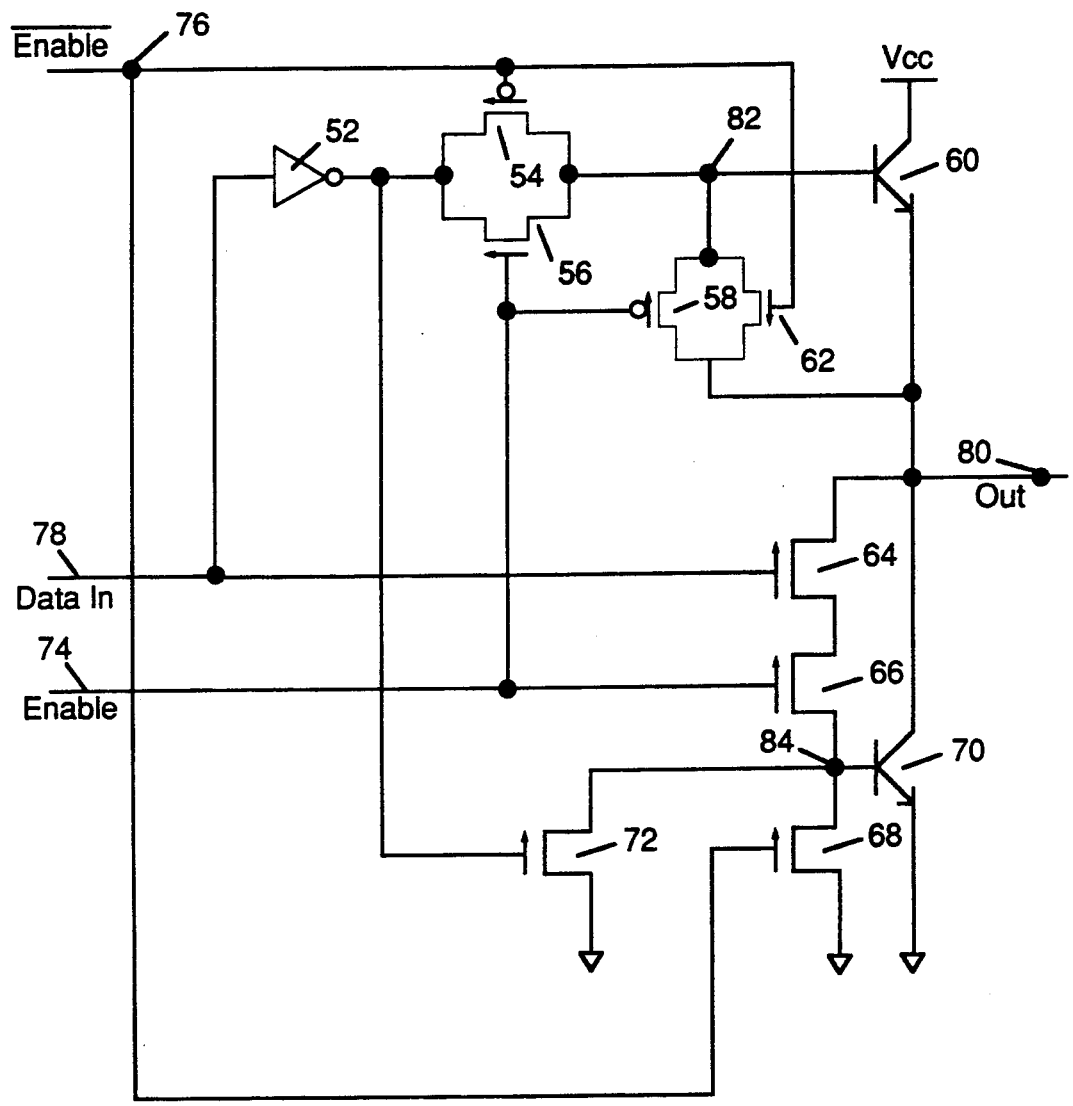
FIG. 2 is a circuit diagram of a tristate driver circuit constructed in accordance with the invention.
Figure 2:
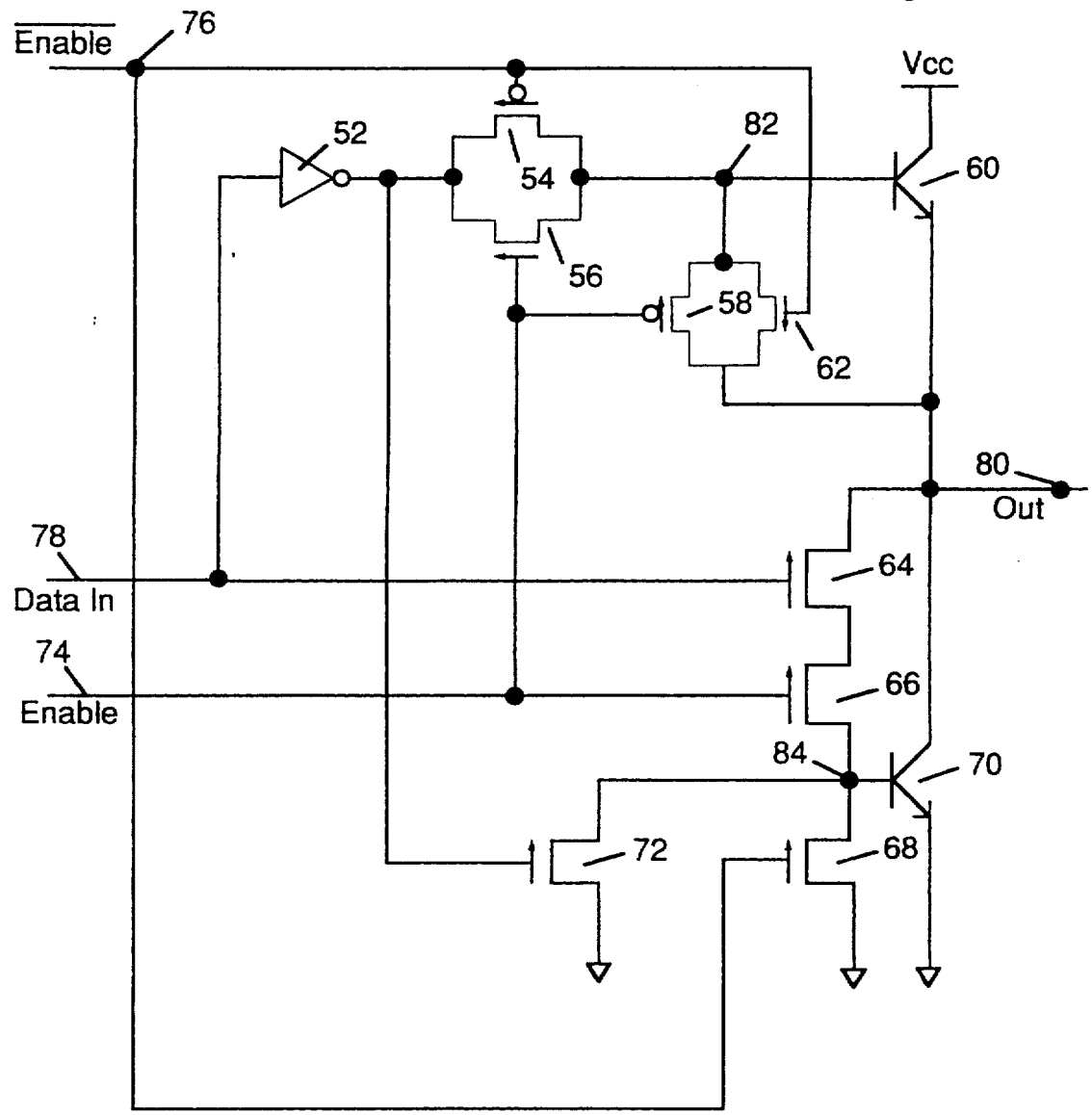

The sheet of drawing consisting of Figure 2 should be deleted to appear as per attached.

Signed and Sealed this

Twenty-eighth Day of October, 1997

Attest:

BRUCE LEHMAN

*Attesting Officer*         *Commissioner of Patents and Trademarks*

United States Patent [19]

Bhamidipaty

[11] Patent Number: 5,107,142
[45] Date of Patent: Apr. 21, 1992

[54] APPARATUS FOR MINIMIZING THE REVERSE BIAS BREAKDOWN OF EMITTER BASE JUNCTION OF AN OUTPUT TRANSISTOR IN A TRISTATE BICMOS DRIVER CIRCUIT

[75] Inventor: Achyutram Bhamidipaty, Milpitas, Calif.

[73] Assignee: Sun Microsystems, Inc., Mountain View, Calif.

[21] Appl. No.: 605,566

[22] Filed: Oct. 29, 1990

[51] Int. Cl.⁵ .................. H03K 19/01; H03K 19/094; H03K 19/082; H03K 19/017
[52] U.S. Cl. .................. 307/446; 307/451; 307/473; 307/475; 307/570
[58] Field of Search ............ 307/446, 448, 473, 570, 307/475, 450, 451, 279

[56] References Cited

U.S. PATENT DOCUMENTS

| | | | |
|---|---|---|---|
| 4,649,294 | 3/1987 | McLaughlin | 307/446 |
| 4,703,203 | 10/1987 | Gallup et al. | 307/473 X |
| 4,746,817 | 5/1988 | Banker et al. | 307/446 |
| 4,791,320 | 12/1988 | Kawata et al. | 307/446 |
| 4,804,868 | 2/1989 | Masuda et al. | 307/446 |
| 4,804,869 | 2/1989 | Masuda et al. | 307/446 |
| 5,006,732 | 4/1991 | Nakamura | 307/473 |

Primary Examiner—David C. Nelms
Assistant Examiner—David R. Bertelson
Attorney, Agent, or Firm—Blakely, Sokoloff, Taylor & Zafman

[57] ABSTRACT

A tristate driver circuit including a first output transistor for furnishing a first output voltage at an output terminal in the on condition, the first transistor being susceptible to disablement or degraded operation from back biasing in the presence of voltages above a particular level at the output terminal in the off condition, a second output transistor for furnishing a second output voltage at the output terminal in the on condition, apparatus for biasing the first and second transistors to allow operation thereof in the presence of enable signals and to disable operation in the absence of enable signals, and apparatus for eliminating back biasing of the first transistor in the absence of enable signals.

6 Claims, 2 Drawing Sheets